United States Patent [19]
Kato et al.

[11] Patent Number: 5,898,316
[45] Date of Patent: Apr. 27, 1999

[54] MODE SETTING CIRCUIT OF SEMICONDUCTOR DEVICE

[75] Inventors: Tetsuo Kato; Tsukasa Ooishi; Hideto Hidaka; Mikio Asakura, all of Hyogo, Japan

[73] Assignee: Mitsubishi Denki Kabushiki Kaisha, Tokyo, Japan

[21] Appl. No.: 08/673,244

[22] Filed: Jun. 27, 1996

[30] Foreign Application Priority Data

Jul. 14, 1995 [JP] Japan .................................... 7-178323
Nov. 28, 1995 [JP] Japan .................................... 7-309582

[51] Int. Cl.$^6$ ................................................ H03K 19/173

[52] U.S. Cl. ................................ 326/38; 326/37; 326/50; 365/189.09

[58] Field of Search .................................. 326/37–38, 39, 326/44–45, 49–50; 365/222, 189.09, 225.7

[56] References Cited

U.S. PATENT DOCUMENTS

| | | |
|---|---|---|
| 5,402,390 | 3/1995 | Ho et al. . |
| 5,410,510 | 4/1995 | Smith et al. . |
| 5,412,260 | 5/1995 | Tsui et al. .................................. 326/38 |
| 5,459,684 | 10/1995 | Nakamura et al. ................. 365/189.09 |
| 5,493,241 | 2/1996 | Landry et al. ........................... 326/105 |
| 5,563,821 | 10/1996 | Kumagai et al. ..................... 365/225.7 |

FOREIGN PATENT DOCUMENTS 3-214669  9/1991  Japan .

*Primary Examiner*—Jon Santamauro
*Attorney, Agent, or Firm*—McDermott, Will & Emery

[57] ABSTRACT

Two NAND gates are provided corresponding to each of a plurality of pads. By connecting a mode switching pad to power supply potential or ground potential, one of the two NAND gates provided corresponding to each pad is activated, and the other NAND gate is non-activated. As a result, different mode select signals are provided from the output of each NAND gate.

2 Claims, 11 Drawing Sheets

| PAD A´ | PAD B´ | R4KE | R8KE |
|--------|--------|------|------|
| H | H | H | L |
| L | L | L | H |

FIG.11 PRIOR ART

|    | INPUT SIGNAL ||||
|----|---|---|---|---|
|    | A | B | C | D |
| 1  | 0 | 0 | 0 | 0 |
| 2  | 1 | 0 | 0 | 0 |
| 3  | 0 | 1 | 0 | 0 |
| 4  | 1 | 1 | 0 | 0 |
| 5  | 0 | 0 | 1 | 0 |
| 6  | 1 | 0 | 1 | 0 |
| 7  | 0 | 1 | 1 | 0 |
| 8  | 1 | 1 | 1 | 0 |
| 9  | 0 | 0 | 0 | 1 |
| 10 | 1 | 0 | 0 | 1 |
| 11 | 0 | 1 | 0 | 1 |
| 12 | 1 | 1 | 0 | 1 |
| 13 | 0 | 0 | 1 | 1 |
| 14 | 1 | 0 | 1 | 1 |
| 15 | 0 | 1 | 1 | 1 |
| 16 | 1 | 1 | 1 | 1 |

MODE SETTING CIRCUIT OF SEMICONDUCTOR DEVICE

BACKGROUND OF THE INVENTION

1. Field of the Invention

The present invention generally relates to a mode setting circuit of a semiconductor device. More particularly, the present invention relates to a mode setting circuit of a semiconductor device which sets a tuning voltage and switches a refresh cycle using the same pads formed on a semiconductor chip.

2. Description of the Background Art

Semiconductor memory devices (DRAMs (dynamic random access memories) in particular) are classified into hundreds of and thousands of product groups according to their functions. According to a refresh cycle, for example, these devices are classified into a 8 k refresh cycle product, a 4 k refresh cycle product, and the like. A mode switching function is used for such classification. More specifically, a semiconductor device is designed to be able to carry out refresh both in a 8 k refresh cycle and in a 4 k refresh cycle, and either of the refresh cycles is selected according to the mode switching function.

FIG. 9A shows a conventional mode switching circuit which is built in a DRAM. Pads 11 and 12 for mode switching are formed on a semiconductor chip of the DRAM. Pad 11 is connected to the input of an inverter 21 and one input end of an NOR gate 32. The output of inverter 21 is connected to one input end of an NOR gate 31. Pad 12 is connected to the input of an inverter 22 and the other input end of NOR gate 32. The output of inverter 22 is connected to the other input end of NOR gate 31. A switch signal R4KE for switching to the 4 k refresh cycle is provided from the output of NOR gate 31, and a switch signal R8KE for switching to the 8 k refresh cycle is provided from the output of NOR gate 32.

FIG. 9B is a truth table for describing operation of the circuit shown in FIG. 9A. When it is desired to carry out refresh in the 8 k refresh cycle, pads 11 and 12 are set to a ground potential to attain a logical low or L level. In response to a signal at the L level, NOR gate 32 is opened, and the switch signal R8KE is output. Since outputs of inverters 21 and 22 attain a logical high or H level at this time, NOR gate 31 is closed, and the switch signal R4KE attains the L level.

When the refresh cycle is switched to the 4 k refresh cycle, pads 11 and 12 are connected to a power supply line, respectively, and attain the H level. Since both inputs of NOR gate 32 attain the H level, the gate is closed, and the switch signal R8KE attains the L level. Since the outputs of inverters 21 and 22 attain the L level, NOR gate 31 is opened, and the switch signal R4KE is set at the H level. By setting pads 11 and 12 at the H or L level as described above, any one of the two refresh cycles can be selected.

On the other hand, in the DRAM, in order to improve the reliability, an external power supply voltage is down-converted to a desired potential in the semiconductor device, or a tuning circuit is used for readjusting an internal voltage (substrate voltage, for example) changed by variation in the manufacturing process to a desired value. Improvement of the characteristics of the semiconductor device is thus pursued.

FIG. 10 is a circuit diagram showing one example of a conventional tuning circuit. In the example shown in FIG. 10, four pads 16 to 19 are used so that 16 kinds of level set signals can be provided. Referring to FIG. 10, pad 16 is connected to the input of an inverter 23, the output of inverter 23 is connected to the gate of p channel transistor 34 and the input of an inverter 24, and the output of inverter 24 is connected to the gate of an n channel transistor 33. Pad 17 is connected to the input of an inverter 25, the output of inventer 25 is connected to the gate of a p channel transistor 36 and the input of an inverter 26, and the output of inventer 26 is connected to the gate of an n channel transistor 35. Pad 18 is connected to the input of an inventer 27, the output of inverter 27 is connected to the gate of a p channel transistor 38 and the input of an inverter 28, and the output of inventer 28 is connected to the gate of an n channel transistor 37. Pad 19 is connected to the input of an inverter 29, the output of inverter 29 is connected to the gate of a p channel transistor 40 and the input of an inverter 30, and the output of inverter 30 is connected to the gate of an n channel transistor 39.

Further, a p channel transistor 42 is connected in parallel with n channel transistor 33 and p channel transistor 34, a p channel transistor 43 is connected in parallel with n channel transistor 35 and p channel transistor 36, a p channel transistor 44 is connected in parallel with n channel transistor 37 and p channel transistor 38, and a p channel transistor 45 is connected in parallel with n channel transistor 39 and p channel transistor 40. These p channel transistors 42 to 45 are connected in series, with their gates grounded. A p channel transistor 41 is connected between the drain of n channel transistor 42 and a power source. A level set signal is output from the connection point between p channel transistors 41 and 42.

FIG. 11 shows the relationships between inputs at respective pads and level set signals in the tuning circuit shown in FIG. 10. The tuning circuit shown in FIG. 10 can select 16 kinds of level set signals by setting four pads 16 to 19 to the L or H level as shown in FIG. 11. Based on these level set signals, the tuning circuit can set the internal voltage to a desired potential.

However, providing the conventional mode switching circuit and the conventional tuning circuit within one DRAM causes the number of pads to be increased, which in turn increases the chip area.

SUMMARY OF THE INVENTION

The main object of the present invention is to provide a mode setting circuit of a semiconductor device capable of using the same pads to switch among various kinds of modes with the reduced number of pads.

In brief, a mode setting circuit of a semiconductor device capable of setting different modes using the same pads formed on a semiconductor chip according to the present invention includes a plurality of pads and a mode switching pad for switching these pads from pads for setting a first mode to pads for setting a second mode, which are formed on the semiconductor chip. Two gate circuits are provided corresponding to each pad. One input end of each gate circuit is connected to the corresponding pad. The other input end of one gate circuit is connected to the mode switching pad, and an inversion signal of a signal applied to the mode switching pad is applied to the other input end of the other gate circuit.

Therefore, according to the present invention, by connecting the mode switching pad to a high potential or a low potential, a signal for activating the first mode or the second mode can be provided from each gate circuit. Therefore, the same pads can be used for setting the first mode and the second mode, whereby the number of pads can be decreased, and the chip area can be made small.

Preferably, the first mode is for setting an internal power supply voltage of the semiconductor device, and the second mode is for switching the refresh cycle.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a diagram showing the relationship between input signals and level set signals in the tuning circuit shown in FIG. 10.

DESCRIPTION OF THE PREFERRED EMBODIMENTS

Figure 1:
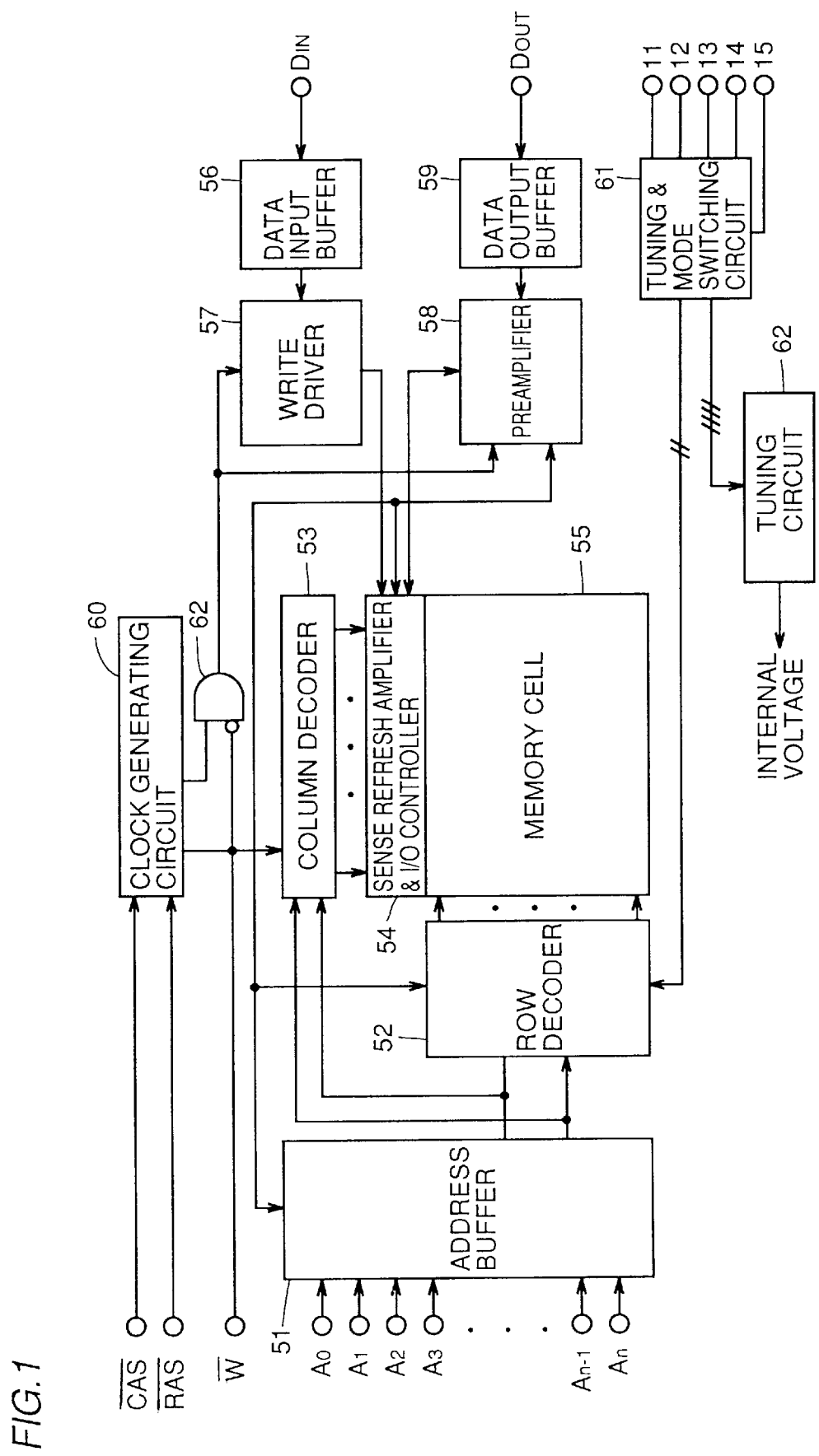
FIG. 1 is a block diagram showing the entire configuration of a DRAM to which a first embodiment of the present invention is applied.

The first embodiment of the present invention will be described with reference to FIG. 1. Referring to FIG. 1, a clock generating circuit 60 receives externally applied column address strobe signal $\overline{CAS}$ and row address strobe signal $\overline{RAS}$ to generate an internal control signal. The internal control signal is applied to an address buffer 51, a row decoder 52, a sense refresh amplifier and I/O controller 54, and a preamplifier 58. Address buffer 51 strobes externally applied address signals $A_o$ to $A_n$ in response to the internal control signal, and applies the row address signal and the column address signal to row decoder 52 and column decoder 53, respectively. Row decoder 52 specifies an X address of memory cell 55, and column decoder 53 specifies a Y address of a memory cell 55 through sense refresh amplifier and I/O controller 54.

At the time of writing, a write enable signal $\overline{W}$ attains the L level. A gate circuit 62 is opened, and a write driver 57 is activated. Data externally applied to a data input buffer 56 is written in memory cell 55 through sense refresh amplifier and I/O controller 54. In response to the H level of the write enable signal $\overline{W}$, data is read out from memory cell 55 through sense refresh amplifier and I/O controller 54, and provided externally from preamplifier 58 through a data output buffer 59.

Figure 6:
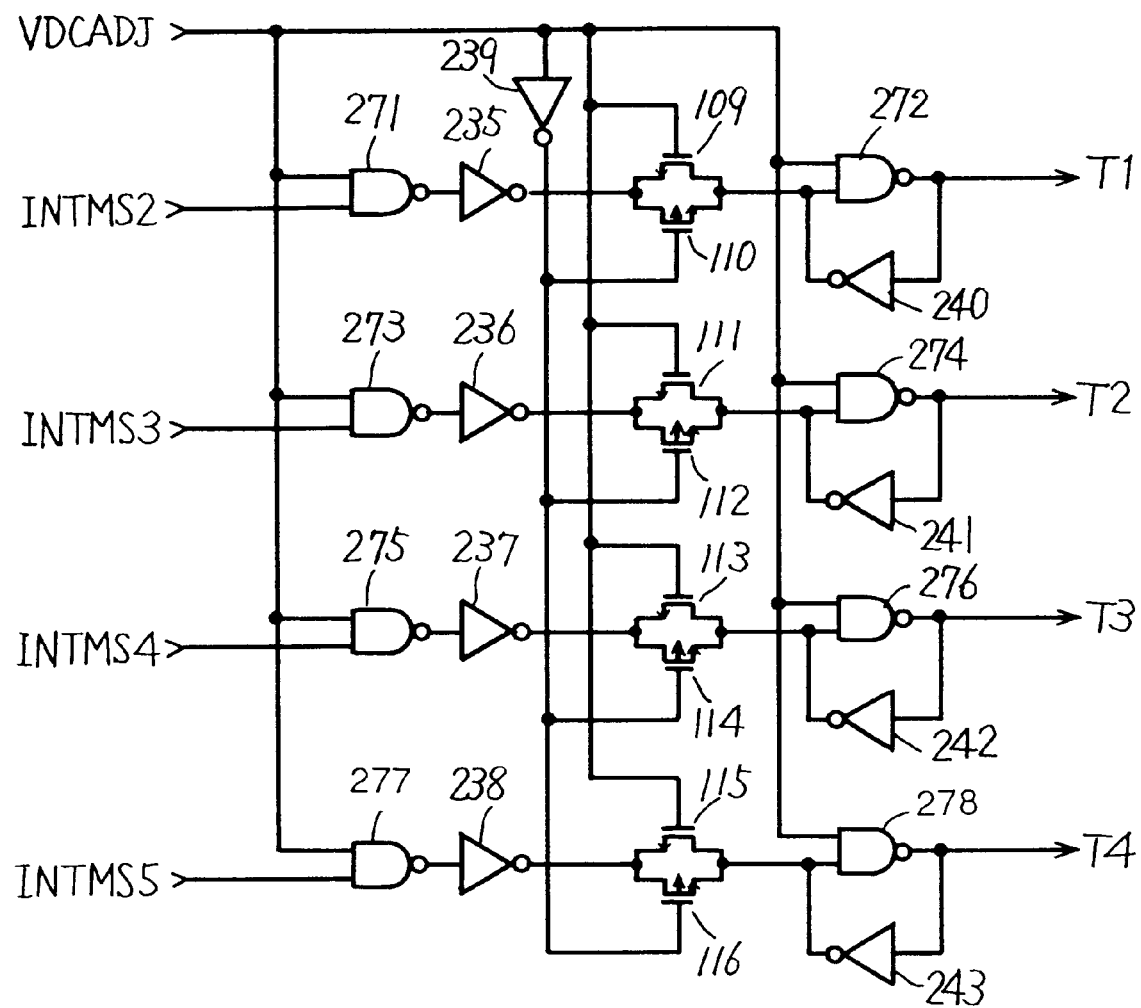
FIG. 6 is a diagram showing a tuning mode switching circuit of the fourth embodiment of the present invention.

A tuning and mode switching circuit 61, which characterizes the present invention, provides a set signal for setting an internal potential to a tuning circuit 62, or provides a signal for setting a 8 k refresh mode or 4 k refresh mode to row decoder 52, according to set potentials in pads 11 to 15. The above described circuit shown in FIG. 6 is used as tuning circuit 62, to which the set signal is applied instead of pads 16 to 19 of FIG. 6. The refresh mode is switched between the 8 k refresh cycle and the 4 k refresh cycle according to the signals R8KE and R4KE applied to row decoder 52.

Figure 2:
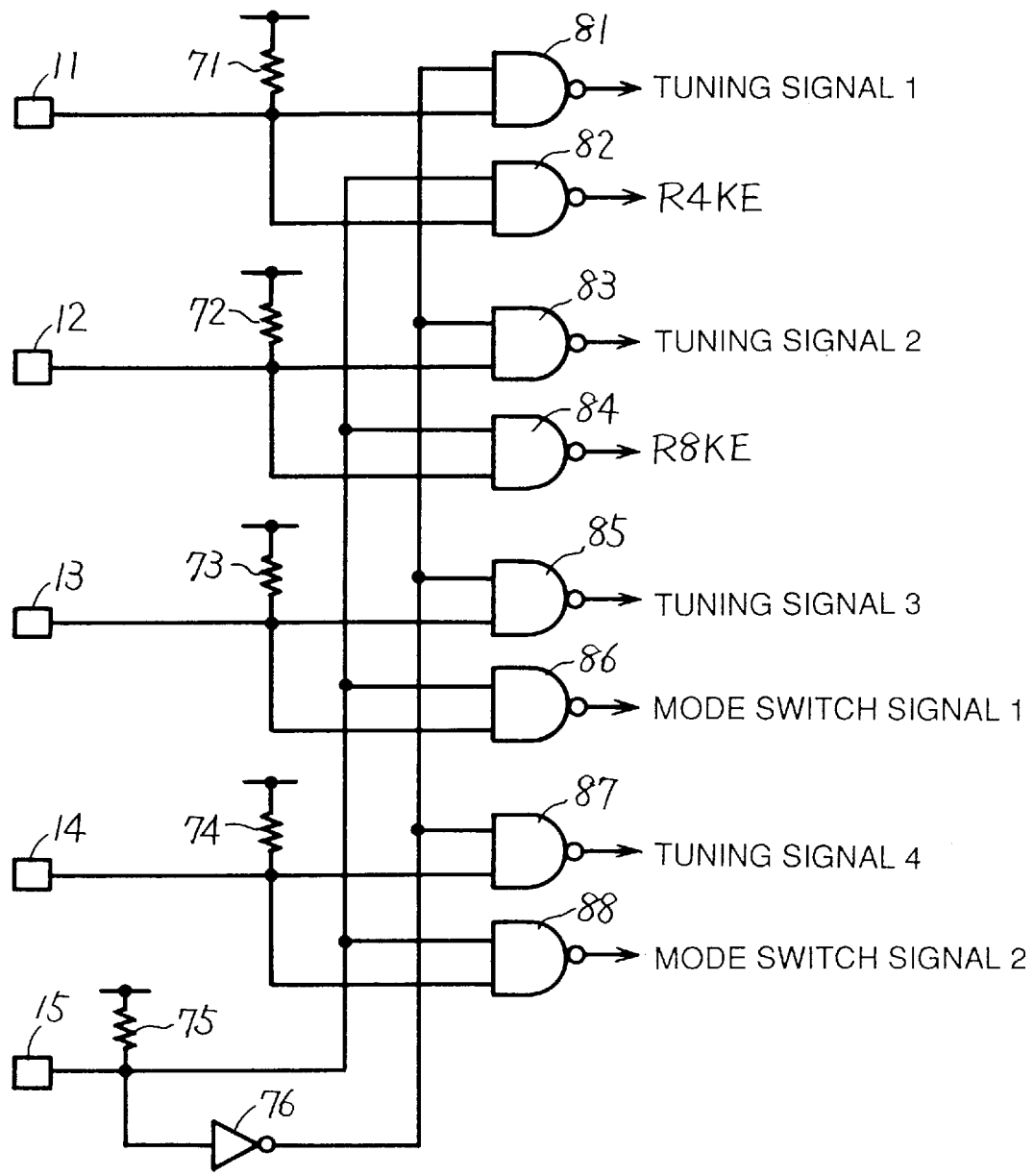
FIG. 2 is an electric circuit diagram of the first embodiment of the present invention.

FIG. 2 shows a specific circuit diagram of tuning and mode switching circuit 61 shown in FIG. 1. Referring to FIG. 2, pad 11 is connected to one input ends of NAND gates 81 and 82, pad 12 is connected to one input ends of NAND gates 83 and 84, pad 13 is connected to one input ends of NAND gates 85 and 86, and pad 14 is connected to one input ends of NAND gates 87 and 88. Pad 15 is connected to the other input ends of NAND gates 82, 84, 86, and 88 and the input end of an inverter 76, and the output of inverter 76 is connected to the other input ends of NAND gate 81, 83, 85, and 87. Pull-up resistors 71 to 75 are connected between respective pads 11 to 15 and a power supply Vcc line. NAND gates 81, 83, 85, and 87 output tuning signals 1 to 4. These tuning signals 1 to 4 are applied to inverters 23, 25, 27, and 29 instead of pads 16 to 19 shown in FIG. 6. NAND gates 82 and 84 output the signals R4KE and R8KE for switching the refresh cycle. These signals are applied to row decoder 52 shown in FIG. 1 instead of NOR gates 31 and 32 shown in FIG. 5.

Operation will now be described. When input signals from pads 11 to 14 are used for switching the refresh cycle mode, pad 15 is bonded to the power supply line. As a result, one input ends of NAND gates 82, 84, 86, and 88 are forced to the H level. Since the output of inverter 76 attains the L level at this time, NAND gates 81, 83, 85, and 87 are closed. When the 4 k refresh cycle is selected, pad 11 is bonded to the power supply line, and pad 12 is bonded to the ground potential. As a result, the output of NAND gate 82 attains the L level, and the output of NAND gate 84 attains the "H" level, resulting in selection of the 4 k refresh cycle mode. When the 8 k refresh cycle is selected, pad 11 is grounded, and pad 12 is connected to the power supply potential. At this time, pads 13 and 14 can be used for switching another mode.

When input signals from pads 11 to 14 are used for setting the tuning potential, pad 15 is connected to the ground potential, and one input ends of NAND gates 82, 84, 86, and 88 attain the L level, whereby the respective gates are closed. Since the output of inverter 76 attains the H level at this time, one input ends of NAND gates 81, 83, 85, and 87 attain the H level. By bonding pads 11 to 14 to the power supply potential or the ground potential, tuning signals 1 to 4 at the H or L level are provided from the outputs of NAND gates 81, 83, 85, and 87. These tuning signals 1 to 4 are applied to the tuning circuit instead of pads 16 to 19 shown in FIG. 6, whereby 16 kinds of level set signals shown in FIG. 7 can be obtained.

Figure 3:
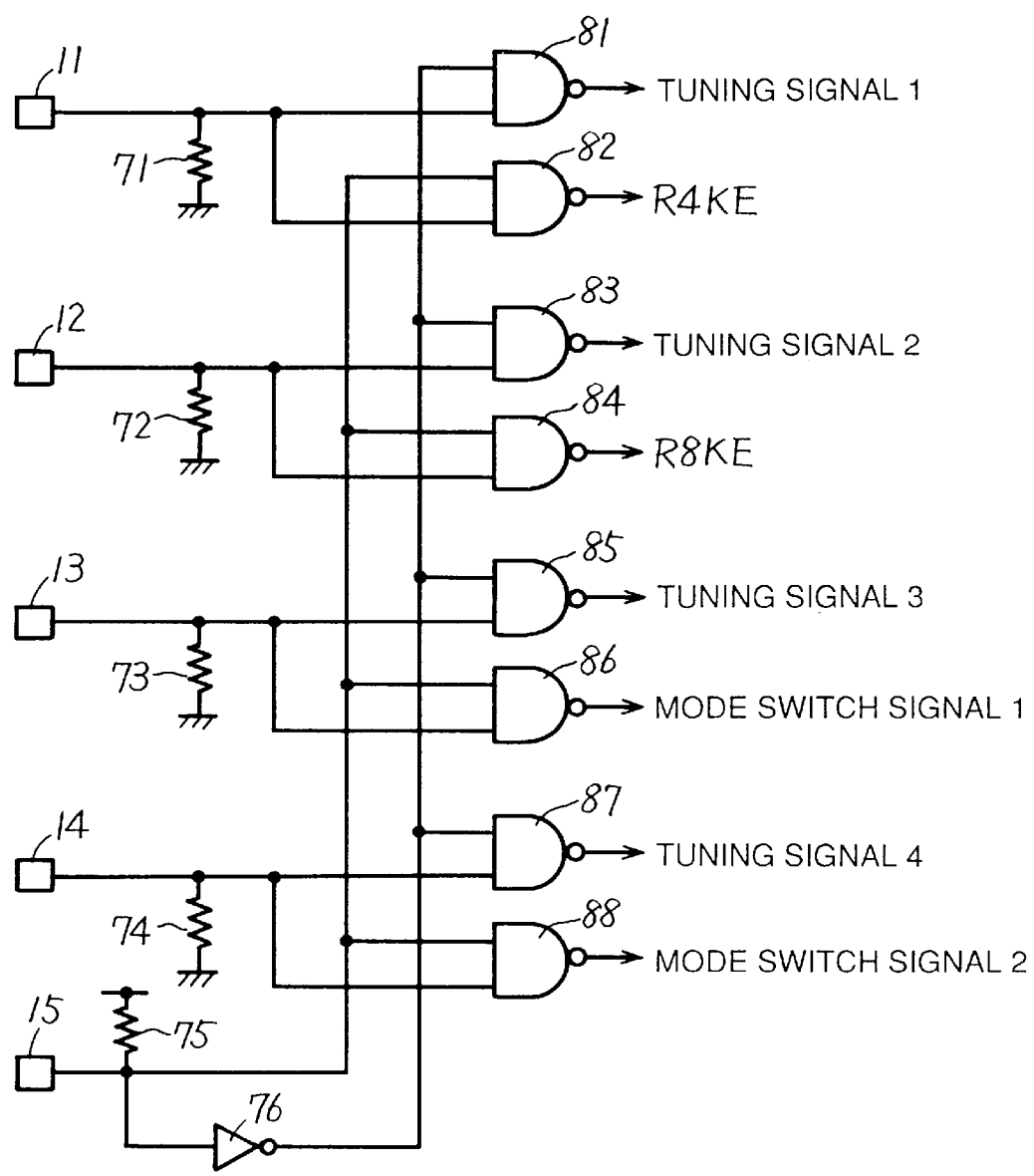
FIG. 3 is an electric circuit diagram of a second embodiment of the present invention.

FIG. 3 is a circuit diagram showing the second embodiment of the present invention. In the above described embodiment shown in FIG. 2, pads 11 to 15 are always set at the power supply potential level by resistors R71 to 75. By connecting any pad to the ground potential, the mode is switched. However, in the embodiment shown in FIG. 3, pads 11 to 14 are always set at a low potential with one ends of resistors R71 to 74 grounded, and any of pads 11 to 15 is connected to the power supply potential. The mode is thus set. Resistor 75 is connected between pad 15 and a power supply Vcc line.

Also in this embodiment, pads 11 to 14 are shared by switching of the refresh cycle and switching of the tuning voltage, whereby the number of pads can be decreased, and the chip area can be made small.

Figure 4:
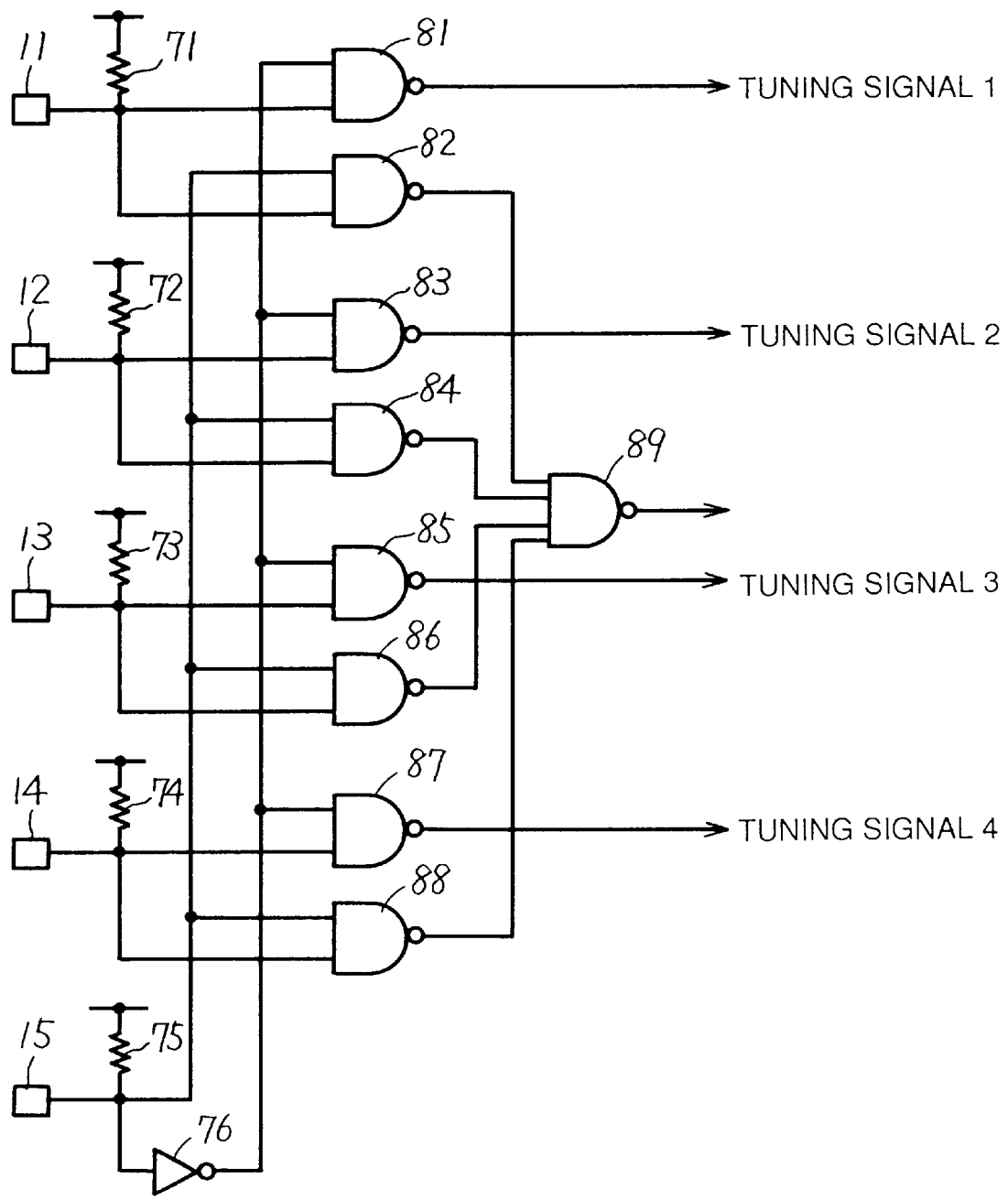
FIG. 4 is an electric circuit diagram of a third embodiment of the present invention.

FIG. 4 is a circuit diagram showing the third embodiment of the present invention. This embodiment is different from the above described embodiment shown in FIG. 2 only in that outputs of NAND gates 82, 84, 86, and 88 are applied to a 4-input NAND gate 89. In this embodiment, tuning signals 1 to 4 are provided with mode switching pad 15 connected to the ground potential. At this time, the outputs of NAND gates 82, 84, 86, and 88 are all set at the H level, the output of NAND gate 89 attains the L level, and the operation mode is set to a default mode which is the mode of the mode switching circuit when the tuning circuit is used. As described above, when the embodiment shown in FIG. 4 is used as the mode switching circuit, the operation mode is set to the default mode of the mode switching circuit. Therefore, no problem occurs in the circuit operation.

Figure 5:
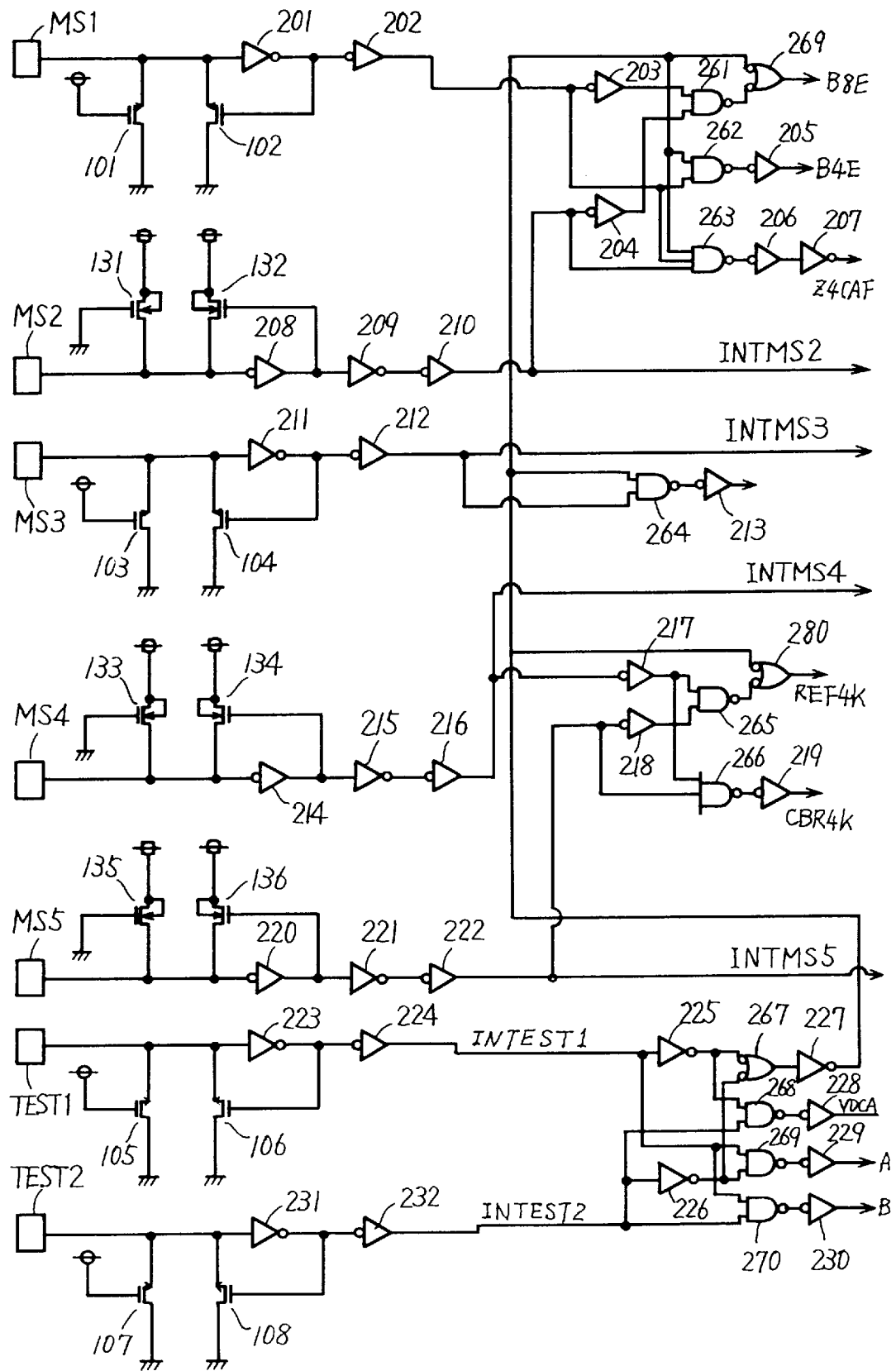
FIG. 5 is a diagram showing a mode switching circuit of a fourth embodiment of the present invention.
Figure 7:
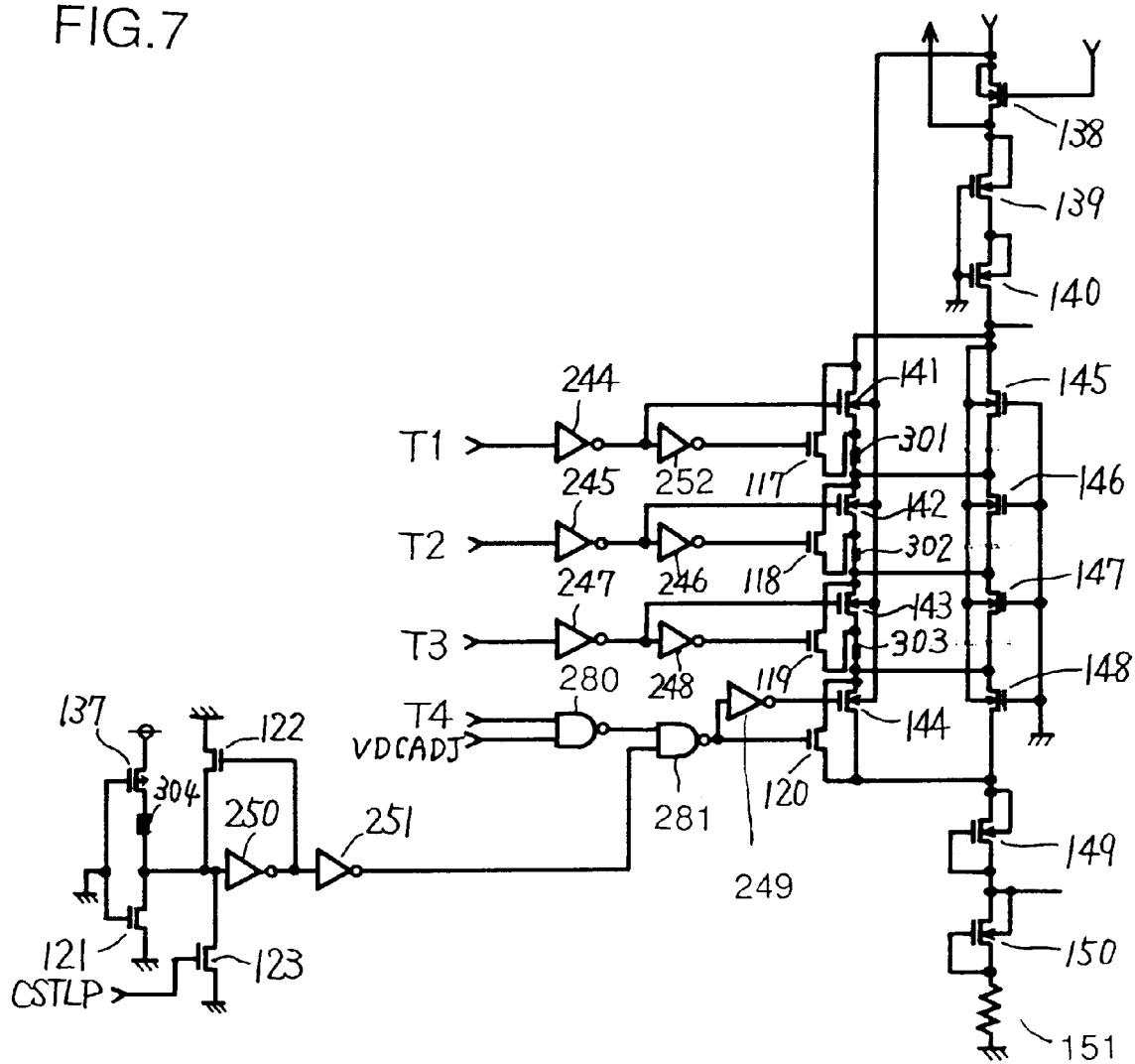
FIG. 7 is a diagram showing a tuning potential generating circuit of the fourth embodiment of the present invention.

FIGS. 5 to 7 are circuit diagrams showing the fourth embodiment of the present invention, in which FIG. 5 shows a mode switching circuit and FIGS. 6 and 7 show a tuning mode switching circuit.

Referring to FIG. 5, mode select pads MS1 to MS5 are provided for switching between a byte, refresh cycle and fast page mode and a hyper page mode. Mode select pad MS1 is connected to the drain of an n channel transistor 101, whose source is grounded. The gate of n channel transistor 101 is supplied with power supply voltage Vcc. When mode select pad MS1 is opened, n channel transistor 101 forces the line of mode select pad MS1 to the L level. Mode select pad MS1 is further connected to the drain of an n channel transistor 102 and the input of an inverter 201. The gate of n channel transistor 102 is connected to the output of inverter 201. The n channel transistor 102 and inverter 201 constitute a half latch, which provides a potential fixed depending on whether mode select pad MS1 is opened or supplied with power supply voltage Vcc. The output of the half latch is inverted by an inverter 202 to be formed into a signal INTMS1.

Mode select pad MS2 is connected to the source of a p channel transistor 131, whose drain is supplied with power supply voltage Vcc and whose gate is grounded. When mode select pad MS2 is opened, p channel transistor 131 forces the line to the H level. The potential of mode select pad MS2 is supplied to a half latch constituted of p channel transistor 132 and an inverter 208. The output of this half latch is inverted by inverters 209 and 210 to be formed into a signal INTMS2.

The line of mode select pad MS3 is constituted similarly to the line of mode select pad MS1. The line of mode select pad MS3 includes an n channel transistor 103 for forcing the line to the L level when mode select pad MS3 is opened, and an n channel transistor 104 and an inverter 211 constituting a half latch, and an inverter 212. A signal INTMS3 is provided from the output of inverter 212.

Similarly to the line of mode select pad MS2, the line of mode select pad MS4 includes a p channel transistor 133 for forcing the line to the H level when mode select pad MS4 is opened, a p channel transistor 134 and an inverter 214 constituting a half latch, and inverters 215 and 216. A signal INTMS4 is provided from the output of inverter 216.

Similarly to the line of mode select pad MS4, the line of mode select pad MS5 includes p channel transistors 135 and 136 and inverters 220 to 222, to provide a signal INTMS5. The line of a test pad TEST1 includes n channel transistors 105 and 106 and inverters 223 and 224, to provide a signal INTEST1. The line of a test pad TEST2 includes n channel transistors 107 and 108 and inverters 231 and 232, to provide a signal INTEST2.

The signal INTMS1 is applied to one input end of an NAND gate 262 and one input end of an NAND gate 263. The signal INTMS1 is inverted by an inverter 203 to be applied to one input end of an NAND gate 261. The output of NAND gate 261 together with a signal ZTUNE to be described later are provided through an NAND gate 279 to be formed into a signal B8E. The signal ZTUNE is applied to the other input end of NAND gate 262, whose output is inverted by an inverter 205 to be formed into a signal B4E.

The signal INTMS2 is applied to one input end of NAND gate 263. The signal INTMS2 is inverted by an inverter 204 to be applied to the other input end of NAND gate 261. The signal ZTUNE is applied to the other input end of NAND gate 263, whose output is inverted by inverters 206 and 207 to be formed into a signal Z4CAS. The signal Z4CAS is used in a general mode, and not used in the present embodiment.

The signal B8E is for specifying X 8-bit refresh, and the signal B4E is for specifying X 4-bit refresh. The signal INTMS3 is applied to one input end of an NAND gate 264, whose other input end is supplied with the signal ZTUNE. The output of NAND gate 264 is inverted by an inverter 213 to be formed into a signal MHYP. The signal MHYP is not used in the present embodiment. The inverse of the signal INTMS4 from an inverter 217 is applied to one input end of an NAND gate 265 and one input end of an NAND gate 266. The signal INTMS5 is applied to one input end of an NAND gate 266, and the inverse of the signal INTMS5 from an inverter 218 is applied to the other input end of NAND gate 265. The output of NAND gate 265 together with the signal ZTUNE are applied to an NAND gate 280, and a signal REF4K indicating 4 k refresh is provided from the output of NAND gate 280. The other input end of NAND gate 266 is supplied with the signal ZTUNE, and the output of NAND gate 266 is inverted by an inverter 219 to be provided as a signal CBR4k. The signal CBR4K indicates 4 k CBR refresh.

The signal INTEST1 is applied to the respective one input ends of NAND gates 269 and 270. The signal INTEST1 is inverted by an inverter 225 to be applied to the respective one input ends of NAND gates 267 and 268. The signal INTEST2 is applied to the other input ends of NAND gates 268 and 270. The signal INTEST2 is inverted by an inverter 226 to be applied to the other input ends of NAND gates 267 and 279. The output of NAND gate 267 is inverted by an inverter 227 to be provided as the signal ZTUNE. The signal ZTUNE closes the above described NAND gates 262, 263, 264 and 266 in a tuning mode. The output of an NAND gate 268 is inverted by an inverter 228 to be formed into a signal VDCADJ. The output of an NAND gate 269 is inverted by an inverter 229 to be provided as a signal tuning A. The output of an NAND gate 270 is inverted by an inverter 230 to be provided as a signal tuning B. These signal tunings A and B are not used in the present embodiment.

FIGS. 6 and 7 show the tuning mode switching circuit.

The signal VDCADJ shown in FIG. 5 is applied to the respective one input ends of NAND gates 271, 273, 275 and 277. The signal VDCADJ closes NAND gates 271, 273, 275 and 277 in selection of a mode. The signals INTMS2 to INTMS5 shown in FIG. 5 are applied to the other input ends of NAND gates 271, 273, 275 and 277. The respective outputs of NAND gates 271, 273, 275 and 277 are inverted by inverters 235 to 238 to be applied to switching circuits formed by combination of n channel transistors 109, 111, 113 and 115 and p channel transistors 110, 112, 114 and 116. The n channel transistors 109, 111, 113 and 115 are turned on in response to the signal VDCADJ attaining the H level, and p channel transistors 110, 112, 114 and 116 are turned on in response to the inverse of the signal VDCADJ from an inverter 239. The outputs of the respective switching circuits are latched by latch circuits formed by combination of an NAND gate 272 and an inverter 240, an NAND gate 274 and an inverter 241, an NAND gate 276 and an inverter 242, and an NAND gate 278 and an inverter 243, to be provided as signals T1 to T4.

As shown in FIG. 7, the signal T1 is inverted by an inverter 244 to be applied to the gate of a p channel transistor 141. The signal T1 is inverted by an inverter 252 to be applied to the gate of an n channel transistor 117. The signal T2 is inverted by an inverter 245 to be applied to the gate of a p channel transistor 142, and inverted by an inverter 246 to be applied to the gate of an n channel transistor 118. The signal T3 is inverted by an inverter 247 to be applied to the gate of a p channel transistor 143, and inverted by an inverter 248 to be applied to the gate of an n channel transistor 119. The signals T4 and VDCADJ are applied to an NAND gate 280, whose output is applied to one input end of an NAND gate 281. The output of NAND gate 281 is applied to the gate of an n channel transistor 120, and inverted by an inverter 249 to be applied to the gate of a p channel transistor 144. The respective drains and sources of p channel transistor 141 and n channel transistor 117, the respective drains and sources of p channel transistor 142 and n channel transistor 118, the respective drains and sources of p channel transistor 143 and n channel transistor 119, and the respective drains and sources of p channel transistor 144 and n channel transistor 120 are connected in parallel, and the respective parallel circuits are connected in series by fuses 301, 302 and 303.

Further, an n channel transistor 138, p channel transistors 139 and 140, n channel transistors 145 to 150 and a resistor 151 are connected in series between power supply and ground. The source of n channel transistor 145 is connected to the source of p channel transistor 141, the source of p channel transistor 146 is connected to the source of p channel transistor 142, the source of p channel transistor 147 is connected to the source of p channel transistor 143, and the source of p channel transistor 148 is connected to the source of p channel transistor 144. The source of p channel transistor 149 is connected to the drain of p channel transistor 144, and a signal VSFN is provided from a connection point between the drain of p channel transistor 149 and the source of p channel transistor 150. This signal VSFN indicates the internal potential level.

The other input end of NAND gate 281 is supplied with a signal allowing generation of a simulated internal potential. This signal is generated as follows. More specifically, an n channel transistor 137, a fuse 304 and an n channel transistor 121 are connected in series, a connection point between fuse 304 and the source of n channel transistor 121 is connected to the input of a latch circuit formed of an inverter 250 and an n channel transistor 122, and the output of the latch circuit is inverted by an inverter 251 to be applied to the other input end of NAND gate 281. When fuse 304 is not melted, NAND gate 281 is opened, allowing generation of the simulated internal potential by input of the signals T1 to T4.

Operation will now be described. When byte is set to X 4 and refresh is set to the CBR4k mode, for example, mode select pad MS1 shown in FIG. 5 is connected to the Vcc line, mode select pad MS5 is connected to the ground line, the other mode select pads MS2, MS3 and MS4 are opened, and test pads TEST1 and TEST2 are opened. Since test pads TEST1 and TEST2 are opened, the inputs of inverters 223 and 231 are brought into the L level by n channel transistors 105 and 107, and the signals INTEST1 and INTEST2 attain the L level, respectively. As a result, both the two inputs of NAND gate 267 attain the H level, and the signal ZTUNE attains the H level, allowing selection of the mode. Since the other input of NAND gate 268 is at the L level, the signal VDCADJ attains the L level, inhibiting selection of the tuning mode.

Since mode select pad MS1 is connected to the Vcc line, the signal INTMS1 attains the H level. Since mode select pads MS2 to MS4 are opened, the signals INTMS2 to INTMS4 attain the L level. Since mode select pad MS5 is connected to the ground line, the signal INTMS5 attains the H level. As a result, since NAND gate 261 is closed and the output attains the H level, the signal B8E attains the L level. Since NAND gate 262 is opened and the output attains the L level, the signal B4E attains the H level. Further, since NAND gate 263 is closed and the output attains the H level, the signal Z4CAS also attains the H level. NAND gate 264 is closed, and the signal MHYP attains the L level. NAND gate 265 is closed, and the signal REF4k which is the output of NAND gate 262 attains the L level. Further, NAND gate 266 is opened, the output attains the L level, the output is inverted by inverter 219, and the signal CBR4k attains the H level. Therefore, as the operation mode, byte is set to X 4 and refresh is set to the CBR4k mode.

Selection of the tuning mode will now be described. In this case, test pad TEST1 is opened, and test pad TEST2 is connected to the Vcc line. As a result, the signal INTEST1 attains the L level, the signal INTEST2 attains the H level, the output of NAND gate 268 attains the L level, and the signal VDCADJ which is the output of inverter 228 attains the H level, thereby allowing selection of the tuning mode. The signal INTEST2 is inverted by inverter 226, the output of inverter 226 attains the L level, the output of NAND gate 267 attains the H level, the signal ZTUNE which is the output of inverter 227 attains the L level, and the signal B8E which is the output of NAND gate 119 attains the H level, resulting in the X 8 byte.

In response to the L level of the signal ZTUNE, NAND gate 262 is closed to cause the signal B4E to attain the L level, NAND gate 263 is closed to cause the signal Z4CAS to attain the H level, NAND gate 264 is closed to cause the signal MHYP to attain the H level, NAND gate 280 is opened to cause the signal REF4k to attain the H level, and NAND gate 266 is closed to cause the signal CBR4k to attain the L level. As a result, the device is in the X 8 byte and 4 k refresh mode, which is not easy for the device operation. This mode is referred to as the default mode.

On the other hand, referring to FIG. 6, in response to the H level of the signal VDCADJ, NAND gates 271, 273, 275 and 277 are opened, the signals INTMS2 to INTMS5 are latched by the latch circuits through the switching circuits to provide the signals T1 to T4. By combination of the signals T1 to T4, the state in which fuses 301 to 303 are actually disconnected is virtually generated to check whether the potential of the signal VSNF is at a desired potential level or not. If the signals T1 and T4 are at the H level and the signals T2 and T3 are at the L level, for example, only n channel transistor 117 and p channel transistor 141 are rendered conductive, and n channel transistors 118, 119 and 120 and p channel transistors 142, 143 and 144 are turned off. This state is the same as the state in which fuses 302, 303 and 304 are disconnected. Only p channel transistor 145 is short-circuited. By series connection of p channel transistors 146, 147 and 148, the potential of the signal VSFN is determined.

Figure 8:
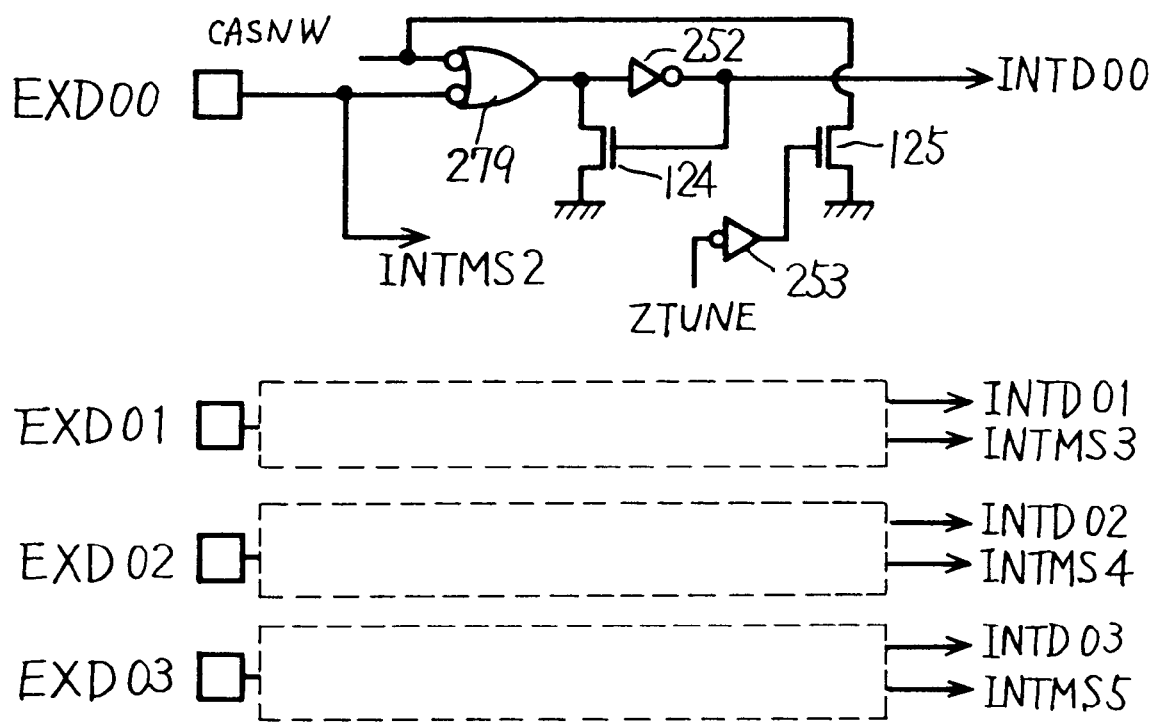
FIG. 8 is a diagram for selecting a multi-bit test mode of a fifth embodiment of the present invention.
Figures 9A, 9B:
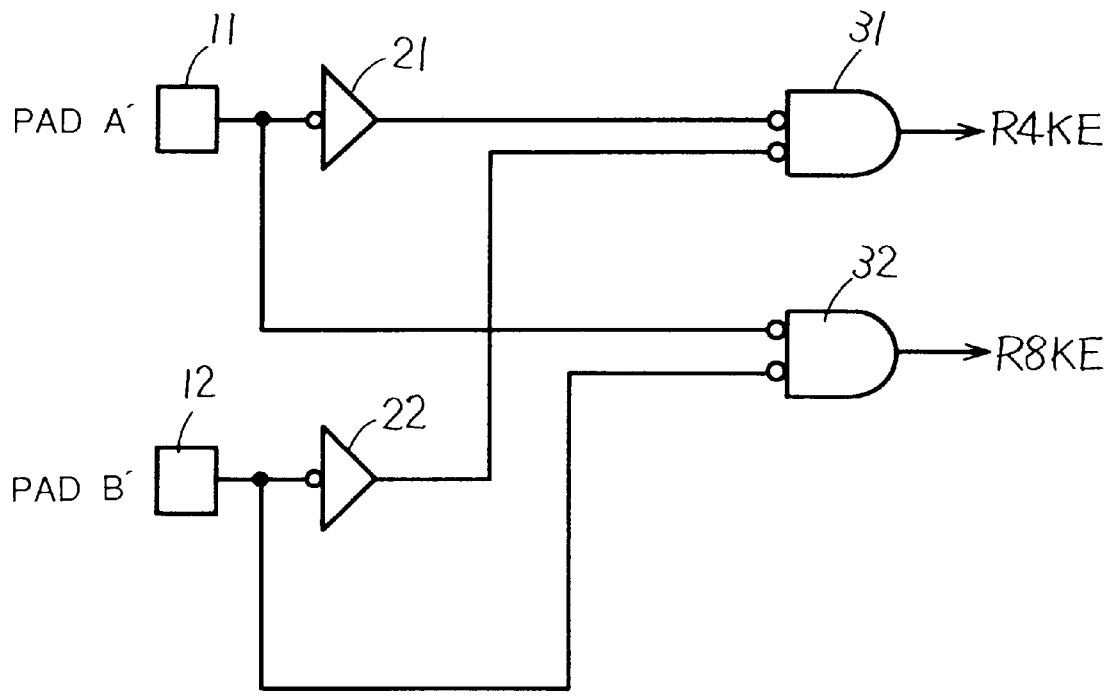
FIG. 9A is a circuit diagram showing a conventional mode switching circuit.
FIG. 9B is a truth table for describing operation of the circuit of FIG. 9A.
Figure 10:
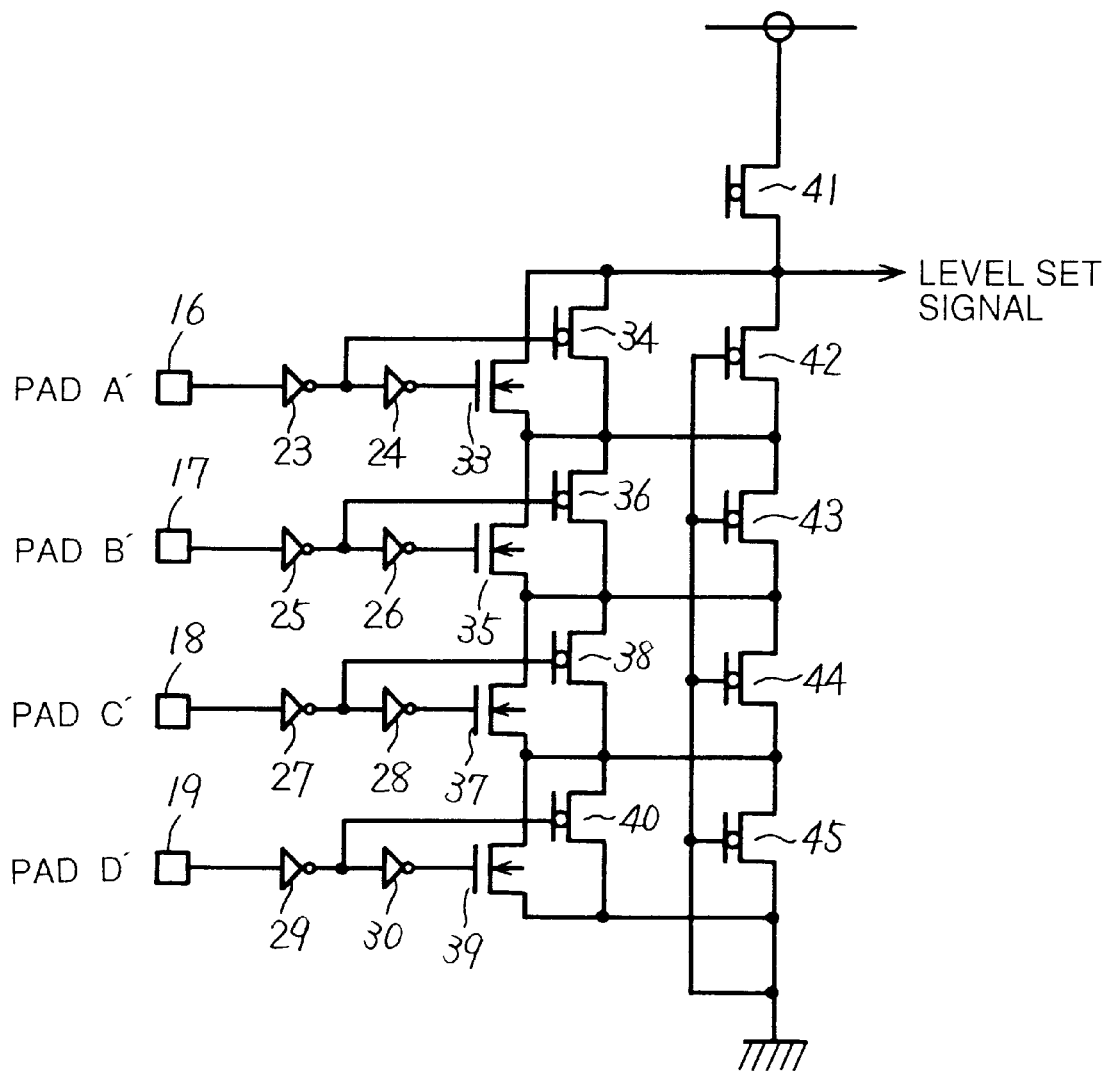
FIG. 10 is a circuit diagram showing a conventional tuning circuit.

FIG. 8 shows the fifth embodiment of the present invention, for selecting the multi-bit test mode. In the multi-bit test mode, data is input/output only through data input terminal DQ7, and data input terminals DQ0 to DQ6 are not required in the case of the X 8 byte. Therefore, four of data input terminals DQ0 to DQ6 are used, and the corresponding pads are used instead of mode select pads MS1 to MS5 shown in FIG. 5. More specifically, in the example shown in FIG. 8, external data input pads EXDO1 to EXDO3 are used, and the pads shown in FIG. 5 are used, as for test mode pads TEST1 and 2. The signals INTMS2 to 5 are provided from external data input pads EXDO1 to EXDO3. An NAND gate 279 is supplied with the signal INTMS2 at one input end and a signal CASNW generated from an externally applied CAS signal at the other input end. The output of NAND gate 279 is latched by a half latch constituted of an inverter 252 and an n channel transistor 124, and the latch output is provided as a signal INTD00. The signal ZTUNE is inverted by an inverter 253 to be applied to the gate of an n channel transistor 125, whose drain is supplied with the signal CASNW and whose source is grounded.

The other external data input pads EXDO1 to EXDO3 are configured similarly to external data input pad EXD00. In response to the signal ZTUNE shown in FIG. 5 attaining the L level, n channel transistor 125 is rendered conductive, one input end of NAND gate 279 is forced to the L level, the output of NAND gate 279 attains the H level, and the signal INTD00 attains the L level. In response to the H level of the signal ZTUNE in the tuning mode, n channel transistor 125 is rendered non-conductive, and one input end of NAND gate 279 attains the H level. Depending on whether external input pad EXD00 being connected to the Vcc level or the ground level, the signal INTD00 attains the H level or the L level.

As described above, in this embodiment, connection of the pad to the Vcc line or the ground line unnecessitates consideration of electrostatic prevention, input capacitance reduction, VIH/VIL margin and the like. Further, when the pad is opened, the line is not used. Therefore, mixture of noise does not raise any problem.

As described above, according to the embodiments of the present invention, a plurality of pads are provided on a semiconductor chip. Two gate circuits are provided corresponding to each pad. By switching two gates by a mode switching pad, the pads are used for setting different modes. Therefore, the number of pads can be decreased and the chip area can be made small.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mode setting circuit of a semiconductor device using a plurality of pads formed on a semiconductor chip to set different modes, comprising:

a mode switching pad formed on said semiconductor chip for switching said plurality of pads between setting a first mode and setting a second mode; and at least two gate circuits of a common type corresponding to each of said plurality of pads, each of said at least two gate circuits having one input end connected to a corresponding pad, another input end of one of said at least two gate circuits being connected to said mode switching pad, and another input end of the other of said at least two gate circuits receiving an inversion signal of a signal applied to said mode switching pad, wherein a combination of signals of a plural bits can be generated at the output of said at least two gate circuits by switching of potential applied to said plurality of pads;

said semiconductor device is a dynamic random access memory (DRAM), said first mode is for setting an internal power supply voltage of said DRAM, and said second mode is for switching a type of a refresh cycle for said DRAM; further comprising internal potential generating means responsive to output of a signal indicating said first mode from said gate circuits for generating a simulated internal potential.

2. The mode setting circuit of a semiconductor device according to claim 1, wherein said internal potential generating means includes a plurality of fuses, a plurality of first transistors connected in series between said respective fuses for receiving a signal indicating said first mode from said gate circuits at the respective input electrodes, and a plurality of second transistors connected in series between a power supply and a ground and connected in parallel to said respective fuses and said respective first transistors for generating an internal potential in response to conduction of any of said plurality of first transistors.

* * * * *